(12) United States Patent
Yamaki et al.

(10) Patent No.: US 8,835,916 B2
(45) Date of Patent: Sep. 16, 2014

(54) ORGANIC THIN FILM AND ORGANIC ELECTROLUMINESCENT ELEMENT CONTAINING SAME IN LIGHT-EMITTING LAYER

(75) Inventors: Takeyuki Yamaki, Nara (JP); Hiroki Yabe, Osaka (JP); Masahiro Nakamura, Eindhoven (NL); Masahito Yamana, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/007,368

(22) PCT Filed: Feb. 17, 2012

(86) PCT No.: PCT/JP2012/001055
§ 371 (c)(1),
(2), (4) Date: Sep. 25, 2013

(87) PCT Pub. No.: WO2012/137400
PCT Pub. Date: Oct. 11, 2012

(65) Prior Publication Data
US 2014/0014936 A1    Jan. 16, 2014

(30) Foreign Application Priority Data
Apr. 5, 2011    (JP) ................. 2011-083314

(51) Int. Cl.
*H01L 29/08*    (2006.01)
*H01L 35/24*    (2006.01)
*H01L 51/00*    (2006.01)
*H01L 51/50*    (2006.01)

(52) U.S. Cl.
CPC .......... *H01L 51/502* (2013.01); *H01L 51/0039* (2013.01)
USPC ........................................... 257/40

(58) Field of Classification Search
USPC .............. 257/88, 99, 40, 642–643, 759, 257/E51.001–E51.052, E25.008–E25.009, 257/E39.007, E27.117–E27.119, 192, 194, 257/285, E29.246–E29.253, 13, 79–103, 257/918, E51.018–E51.022, 257/E33.001–E33.077, E25.028, E31.058, 257/E31.063, E31.115, E25.032, 257/E27.113–E27.139, 125, 164, 198, 514, 257/9, 14, 85, 90, 94, E39, 257/E51.038–E51.04, E23.074, E23.165; 438/69, 82, 99, 22–47, 493, 503, 507, 438/956
See application file for complete search history.

(56) References Cited

U.S. PATENT DOCUMENTS

| | | |
|---|---|---|
| 6,995,505 B2 | 2/2006 | Kim et al. |
| 2004/0217696 A1 | 11/2004 | Kim et al. |
| 2006/0093852 A1 | 5/2006 | Marsitzky et al. |
| 2008/0007157 A1* | 1/2008 | Carroll et al. ................. 313/504 |
| 2010/0320454 A1 | 12/2010 | Wilson et al. |
| 2013/0237680 A1 | 9/2013 | Wilson et al. |

FOREIGN PATENT DOCUMENTS

| | | |
|---|---|---|
| JP | 2004-335438 | 11/2004 |
| JP | 2008-019415 | 1/2008 |
| JP | 2010-013662 | 1/2010 |
| JP | 2010-055899 | 3/2010 |
| JP | 2010-272791 | 12/2010 |
| WO | 2009/093033 | 7/2009 |

OTHER PUBLICATIONS

International Search Report (ISR) in International Pat. Appl. No. PCT/JP2012/001055, dated Apr. 10, 2012.
"The forefront of organic EL technology development", pp. 24 to 25, Technical Information Institute Co., Ltd. (undated), together with a partial English language translation thereof.

\* cited by examiner

*Primary Examiner* — Dao H Nguyen
*Assistant Examiner* — Tram H Nguyen

(74) *Attorney, Agent, or Firm* — Greenblum & Bernstein, P.L.C.

(57) ABSTRACT

In an organic thin film (a light emitting layer) of an organic EL element, an organic thin film having an emitting material which is made up of an organic polymer main backbone polymerized with a molecular chain, which emits light having a maximum value at a wavelength different from a wavelength at which an emission spectrum emitted by the main backbone itself has a maximum value, and nanosized particles which are mixed into the emitting material is used as the light emitting layer. According to the above configuration, the maximum values of the emission spectra of light emitted by the molecular chain and the main backbone of the emitting material can be increased. Moreover, the light which has the emission spectra having the plural maximum values can be generated without depending on the plural emitting materials, so that the light emitting layer can be manufactured easily.

5 Claims, 4 Drawing Sheets

ORGANIC THIN FILM AND ORGANIC ELECTROLUMINESCENT ELEMENT CONTAINING SAME IN LIGHT-EMITTING LAYER

TECHNICAL FIELD

The present invention relates to an organic thin film which is used for a lighting apparatus, a liquid crystal backlight, various displays, display apparatus, or the like and an organic electroluminescent element containing the organic thin film in a light emitting layer.

BACKGROUND ART

In an electroluminescence (EL) device, a light emitting layer is formed on a transparent substrate so as to be interposed between an anode and a cathode. When a voltage is applied between the electrodes, light is emitted by exciters generated by recombination of holes and electrons injected as carriers to the light emitting layer. EL devices are generally classified into organic EL devices in which an organic substance is used as an emitting material of a light emitting layer, and inorganic EL devices in which an inorganic substance is used as an emitting material of a light emitting layer. In particular, organic EL devices are capable of emitting light of high luminance with a low voltage, and various colors of emitted light are obtained therefrom depending on the types of emitting materials. In addition, it is easy to manufacture organic EL devices as planar light emitting panels, and thus organic EL devices are used as various display devices and backlights. Furthermore, in recent years, organic EL devices designed for high luminance have been realized, and attention has been paid to use of these organic EL devices for lighting apparatuses.

FIG. 4 (sic. correctly FIG. 5) shows a cross-sectional configuration of a common organic EL device. In an organic EL element 101, a translucent anode layer 103 is located on a translucent substrate 102, and an organic layer 104 which is made up of a hole injection layer 141, a hole transport layer 142, and a light emitting layer 143 is located on the anode layer 103. A light reflective cathode layer 105 is located on the organic layer 104. When a voltage is applied between the anode layer 103 and the cathode layer 105, light, which is emitted by the light emitting layer 143 of the organic layer 104, passes through the anode layer 103 and the substrate 102 and then is taken out to the outside of the element.

In such an organic EL element 101, when only one type of the emitting material is used for the light emitting layer 143, an emission spectrum of output light has only one maximum value. However, it is necessary to obtain an emission spectrum having plural maximum values to output white light used for the lighting apparatuses or the like. Thus, there is a known organic EL element in which one light emitting layer is doped with plural emitting materials having different emission spectra, respectively (for example, refer to the forefront of organic EL technology development, pp. 24 to 25, Technical Information Institute Co., Ltd, abbreviated as non-patent document hereinafter). Moreover, there is also a known organic EL element which is provided with plural light emitting layers having different emission spectra, respectively.

However, in the organic EL element described in the above non-patent document, the respective emitting material have different life durations depending on their types, use conditions, or the like, so that once an emission of the emitting material which emits light of a predetermined wavelength reduces due to the life-span, the emission of the other emitting materials relatively increases. The white light is generated by mixing the light outputted from the respective emitting materials in a predetermined balance, so that when the emission of any emitting material reduces or increases, the balance of the emission is lost and thus the desired white light cannot be obtained. That is to say, in the organic EL element described in the above non-patent document, the period during which the white light can be obtained depends on the emitting material which has the short life-span. Also when the plural light emitting layers is formed, in the same manner as the above, the period during which the white light can be obtained depends on the emitting material which has the short life-span. Moreover, it is not easy to closely control film thicknesses of the light emitting layers, respectively, and furthermore, plural film forming processes are necessary, so that there is a problem that manufacturing efficiency is reduced.

DISCLOSURE OF THE INVENTION

The present invention is to solve the problem described above, and an object of the present invention is to provide an organic thin film, which enables an obtainment of an emission spectrum having plural maximum values and further can be manufactured in a simple manner, and an organic EL element using the organic thin film.

To solve the above problem, an organic thin film, including: an emitting material which is made up of an organic polymer main backbone polymerized with a molecular chain, which emits light having a maximum value at a wavelength different from a wavelength at which an emission spectrum emitted by the main backbone itself has a maximum value; and nanosized particles which are mixed into the emitting material.

It is preferable that in the organic thin film, the emitting material is a coating material.

It is preferable that in the organic thin film, the main backbone of the emitting material is a fluorene backbone.

It is preferable that in the organic thin film, a particle diameter of the nanosized particle is within 10 to 100 nm.

It is preferable that an organic electroluminescent element which is configured by laminating a substrate, a first electrode layer, an organic layer including a light emitting layer, and a second electrode layer, wherein the organic thin film is included as the light emitting layer.

According to the present invention, the maximum values of the emission spectra of light emitted by the molecular chain and the main backbone of the emitting material can be increased. Moreover, the light which has the emission spectra having the plural maximum values can be generated without depending on the plural emitting materials, so that the light emitting layer can be manufactured easily.

DESCRIPTION OF THE PREFERRED EMBODIMENTS

Figure 1:
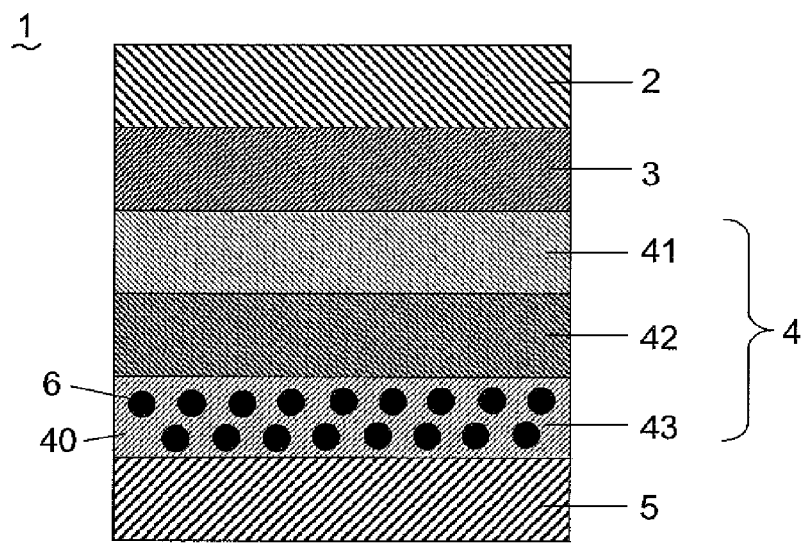
FIG. 1 is a side sectional view of an organic electroluminescent element using an organic thin film according to a preferred embodiment of the present invention.

An organic thin film according to a preferred embodiment of the present invention is described based on an organic electroluminescent element (abbreviated as the organic EL element hereinafter) using the organic thin film as a light emitting layer with reference to FIG. 1. An organic EL element 1 of the present preferred embodiment is configured by laminating, in order from a first electrode layer 3 side, the translucent first electrode layer 3, an organic layer 4, which is made up of a hole injection layer 41, a hole transport layer 42, and a light emitting layer 43 (the organic thin film), and a light reflective second electrode layer 5 on a substrate 2. In the above configuration, the first electrode layer 3 functions as an anode for supplying a hole to the hole injection layer 41, and the second electrode layer 5 functions as a cathode for injecting an electron into a light emitting layer 43.

A transparent glass plate such as a soda-lime glass, a non-alkali glass, or the like or a plastic film or a plastic plate, which is made from polyester resin, polyolefin resin, polyamide resin, epoxy resin, fluorine contained resin, or the like by an optional method, for example, is used for the substrate 2. The substrate 2 may be made of glass into which a heavy metal such as lead, for example, is mixed, and an optional glass may be used.

It is preferable that an electrode material made up of a metal, an alloy, or an electrically-conductive compound having a high work function, or a mixture thereof is used for the first electrode layer 3 so that the hole can be efficiently injected into the organic layer 4, and it is particularly preferable that an electrode material having a work function of 4 eV or more. Such a material of the first electrode layer 3 includes, for example, a metal such as gold, CuI, ITO (Indium Tin Oxide), $SnO_2$, ZnO, IZO (Indium Zinc Oxide), GZO (Gallium Zinc Oxide), a conductive polymer such as PEDOT or polyaniline, another conductive polymer doped with an optional acceptor, or a conductive translucent material such as carbon nanotubes. The first electrode layer 3 can be made by depositing the above electrode material on the surface of the substrate 2 by a vacuum evaporation method, a sputtering method, a coating method, for example, to form a thin film. It is preferable that light transmissibility of the first electrode layer 3 is 70% or more. Moreover, it is preferable that sheet resistance of the first electrode layer 3 is several hundred $\Omega/\square$ or less, and 100$\Omega/\square$ or less is more preferable. Although the film thickness of the first electrode layer 3 differs depending on characteristics such as conductivity of the material, the film thickness is preferably set to 500 nm or less to control the characteristics such as the light transmissibility, the sheet resistance, or the like of the first electrode layer 3 as described above, and is more preferably set within a range of 10 to 200 nm.

The organic layer 4 is made up of a lamination of the above hole injection layer 41, the hole transport layer 42, and the light emitting layer 43, and an appropriate organic layer such as an electron transport layer, a hole block layer, an electron injection layer, or the like (not shown) may also be laminated on the light emitting layer 43. Moreover, the plural light emitting layers 43 may also be formed. In this manner, when the plural light emitting layers 43 are provided, the number laminated layers is preferably five or less and more preferably three or less since difficulty in design of an optical and electrical element increases with increasing the number of laminated layers. Moreover, in this case, it is preferable to provide a charge supply layer (not shown) between the plural organic layers 4. This charge supply layer includes, for example, a metal thin film such as Ag, Au, or Al, a metal oxide such as vanadium oxide, molybdenum oxide, rhenium oxide, or tungsten oxide, a transparent conductive film such as ITO, IZO, AZO, GZO, ATO, or $SnO_2$, a so call laminated body of a n-type semiconductor and a p-type semiconductor, a laminated body of the metal thin film or the transparent conductive film and the n-type semiconductor and/or the p-type semiconductor, a mixture of the n-type semiconductor and the p-type semiconductor, or a mixture of the n-type semiconductor or the p-type semiconductor and the metal. The n-type semiconductor or the p-type semiconductor may be made of an inorganic material or an organic material. Further, it may also be made of a combination of a mixture of the organic material and the metal, the organic material and the metal oxide, the organic material and the organic acceptor/donor material, or the inorganic acceptor/donor material, for example, and these are appropriately selected and used.

A low-molecular-weight organic compound such as copper phthalocyanine (CuPC) or the like or a high polymer material such as Polyethylenedioxythiophene/polystyrenesulfonate (PEDOT-PSS) or the like is used for the hole injection layer 41. The material is not limited to the above, however, a commonly-known optional hole injection material may be used.

A material of the hole transport layer 42 is appropriately selected from a group of compounds having a characteristic of hole transport. This type of compounds includes, for example, a triarylamine-based compound, an amine compound including a carbazole group, an amine compound including fluorene derivative, or the like whose representative examples are 4,4'-Bis[N-(naphthyl)-N-phenylamino]biphenyl (α-NPD), N,N'-Bis(3-methylphenyl)-(1,1'-biphenyl)-4,4'-diamine (TPD), 2-TNATA, 4,4',4"-tris[N-(3-methylphenyl)N-phenylamino]triphenylamine (MTDATA), 4,4'-N,N'-dicarbazole-biphenyl (CBP), Spiro-NPD, Spiro-TPD, Spiro-TAD, or TNB. The material is not limited to the above, however, a commonly-known optional hole transport material may be used.

The light emitting layer 43 is formed of a composition made by mixing an after-mentioned emitting material 40 and a nanosized particle 6 into a host material. A compound which is made up of an organic polymer main backbone polymerized with a molecular chain, which emits light having a maximum value at a wavelength different from a wavelength at which an emission spectrum emitted by the main backbone itself has a maximum value, is used as the emitting material 40.

As such a compound, a material made up of fluorene, which is indicated in a chemical formula 1 below as the main backbone and polymerized with acene-based molecule (anthracene, naphthalene, pentacene, or the like), BT(benzothiadiazole), iridium complex, or the like as a molecular chain, may be used. Fluorene emits blue light by itself and has characteristics that it polymerizes the molecular chain since it is a π-conjugated polymer and an energy which is photoexcited or excited by an electric field is transited to the molecular chain easily. The main backbone is not limited to fluorine, however, a π-conjugated polymer material whose main backbone emits light alone is also applicable. Also, the molecule chain is not limited to the above material, however, any material is also applicable as long as it emits light having the maximum value at a wavelength different from a wavelength at which an emission spectrum of a material emitted by the main backbone itself has a maximum value.

[Chemical formula 1]

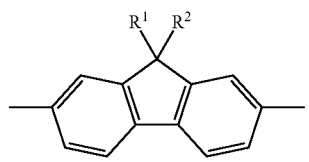

(1)

The above emitting material whose main backbone is the compound made up of the fluorene backbone polymerized with the molecular chain, which emits the light having the maximum value at the wavelength different from the wavelength at which the emission spectrum emitted by the main backbone itself has the maximum value, includes Poly[(9,9-dioctyl-2,7-divinylenefluorenylene)-alt-co-(9,10-anthracene) (ADS106RE; manufactured by American Dye Source, Inc.) indicated in a chemical formula 2 below, for example. In the above compound, a maximum wavelength of an emission spectrum emitted by the main backbone itself is within 430 to 450 nm, and a maximum wavelength of an emission spectrum emitted by the molecule chain is within 530 to 550 nm.

[Chemical formula 2]

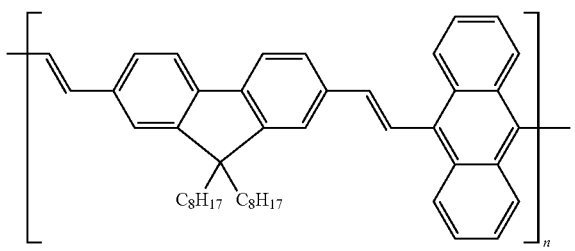

(2)

Moreover, the above emitting material includes F8BT (Poly[(9,9-di-n-octylfluorenyl-2,7-diyl)-alt-(benzo[2,1,3] thiadiazol-4,8-diyl)]) indicated in a chemical formula (3) below, for example. In the above compound, a maximum wavelength of an emission spectrum emitted by the main backbone itself is within 430 to 450 nm, and a maximum wavelength of an emission spectrum emitted by the molecule chain is within 635 to 655 nm.

[Chemical formula 3]

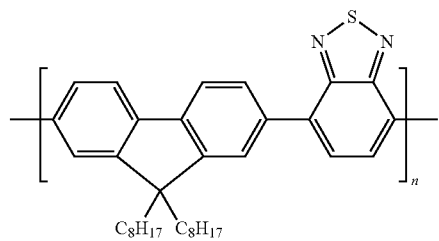

(3)

Furthermore, the above emitting material includes F6BT (Poly[(9,9-di-n-hexylfluorenyl-2,7-diyl)-alt-(benzo[2,1,3] thiadiazol-4,8-diyl)]) indicated in a chemical formula (4) below, for example. In the above compound, a maximum wavelength of an emission spectrum emitted by the main backbone itself is within 390 to 420 nm, and a maximum wavelength of an emission spectrum emitted by the molecule chain is within 635 to 655 nm.

[Chemical formula 4]

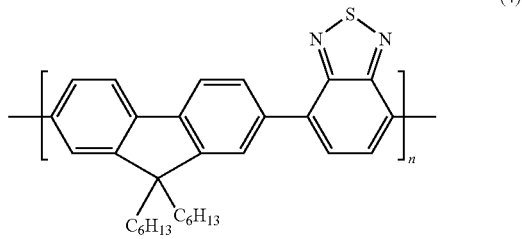

(4)

A metal oxide fine particle such as ITO or ATO, for example, zirconia, or the like is used as the nanosized particle 6, and a material having a refractive index lower than that of the above emitting material 40 is preferable. A refractive index of a common emitting material is around 1.7 to 1.8 and is higher than that of a glass substrate, which is widely used for the substrate 2, and atmosphere, so that light emitted by the light emitting layer 43 is often reflected totally at the interface between the light emitting layer 43 and the substrate 2 and thus does not reach the substrate 2 and the atmosphere. Accordingly, when the refractive index of the light emitting layer 43 is reduced, a critical angle at the above interface can increase and the total reflection can be prevented.

The nanosized particle 6 having the lower refractive index than that of the emitting material 40 includes, for example, a porous silica particle whose representative examples are magnesium fluoride, a silica, a hollow silica, a nanoporous silica, and a mesoporous silica. In particular, the mesoporous silica is preferably used as the nanosized particle 6. That is to say, porosity of the mesoporous silica can be increased more than that of the hollow silica, so that the mesoporous silica is effective in reducing the refractive index, and a particle diameter can be controlled while maintaining a predetermined porosity. Moreover, the mesoporous silica has a functional group on its surface, so that it has characteristics that various surface processing can be performed easily and dispersibility to other materials can be enhanced easily. It is more preferable to use the mesoporous silica treated with heat at high temperature of 400 degrees Celsius.

It is preferable that the particle diameter of the nanosized particle 6 is within 10 to 100 nm. A film thickness of each layer in the organic layer 4 is a wavelength order of visible light. In particular, the film thickness of the light emitting layer 43 is designed to obtain an interference effect in an optimum interference condition and is normally within 50 to 200 nm. Moreover, it is desirable that the interface between the light emitting layer 43 and the organic layer 4 is flat to enable the uniform film formation and equalize a surface resistance. That is to say, when the particle diameter of the nanosized particle is appropriately set within 10 to 100 nm as described above, the nanosized particle does not have an influence on the film thickness of the light emitting layer 43, and a surface roughness of the light emitting layer 43 can be reduced.

A constitution method of the light emitting layer 43 includes a method of applying a composition, in which the nanosized particle 6 is mixed into the emitting material 40 in advance, on a foundation layer (the hole transport layer 42 shown in FIG. 1) of the light emitting layer 43 to laminate the composition. That is to say, when the emitting material for coating is used, the light emitting layer 43 can be manufactured without depending on a complex manufacturing process, a major manufacturing equipment, or the like. Moreover, it is also applicable to form the mesoporous silica film on the hole transport layer 42 in advance and then laminate the emitting material 40 to constitute the light emitting layer 43. Furthermore, it is also applicable to laminate the light emitting layer 43 on the hole transport layer 42 in a predetermined thickness, then form the mesoporous silica film, and further laminate the light emitting material 40 on it to constitute the light emitting layer 43. In this case, it is preferable that the thickness of the emitting material 40 laminated on the hole transport layer 42 is 20 nm or less.

An electron transport layer (not shown) may be formed between the light emitting layer 43 and the second electrode layer 5. The material used for forming the electron transport layer can appropriately be selected from a commonly-known group of compound having an electron transport property. This type of compound includes a metal complex known as the electron transport material such as $Alq_3$, a compound having a hetero ring such as phenanthroline derivative, pyridine derivative, tetrazine derivative, or oxadiazole derivative, or the like, however, the material is not limited to the above. Moreover, an electron injection layer (not shown) may also be formed between the electron transport layer and the second electrode layer 5.

It is preferable that a metal, an alloy, an electroconductive compound, or a mixture of the above materials having a low work function is used for the second electrode layer 5 so as to efficiently inject the electrons into the light emitting layer 44, it is particularly preferable that the work function is 5 eV or less. The material such as an alkali metal, an alkali metal halide, an alkali metal oxide, an alkali earth metal, or an alloy of the above materials and other metal, for example, is used to constitute the second electrode layer 5. In particular, Aluminum (Al), silver (Ag), or a compound including these metals may be used. Moreover, the second electrode layer 5 may also be made as a laminated structure of combining Al and the other electrode material. The combination of the electrode material includes a laminated body of an alkali metal/Al, alkali metal/silver, alkali metal halide/Al, alkali metal oxide/Al, alkali earth metal/Al, rare-earth metal/Al, an alloy of these metallic series and other metal, or the like. In particular, it includes, for example, sodium (Na), sodium-potassium (K) alloy, lithium (Li), a laminated body of magnesium (Mg) or the like and silver, Mg—Ag mixture, Mg-indium mixture, Al—Li alloy, LiF/Al mixture/laminated body, or $Al/Al_2O_3$ mixture. Moreover, the electrode material may be made by laminating at least one layer of a conductive material such as a metal or the like on a ground, which is made of an alkali metal oxide, an alkali metal halide, or a metal oxide, of the second electrode layer 5. The laminated conductive material is an alkali metal/Al, an alkali metal halide/alkali earth metal/Al, an alkali metal oxide/Al, or the like. Moreover, also as for the other laminated conductive material other than the above laminated conductive materials, it is preferable to insert a layer which enhances the injection of the electrons from the second electrode layer 5 (cathode) into the light emitting layer 43, that is to say, an electron injection layer (not shown) between the cathode and the light emitting layer. A material constituting the electron injection layer includes, for example, a material in common with that of the above second electrode layer 5, a metal oxide such as titanic oxide, zinc oxide, or the like, an organic semiconductor material in which a dopant, which enhances the electron injection like the above materials, is mixed, however, the material is not limited to the above.

The second electrode layer 5 may also be formed of a combination of a transparent electrode and a light reflection layer. When the second electrode layer 5 is formed as a translucent electrode, it may be formed of the transparent electrode typified by ITO, IZO, or the like. The organic layer at an interface of the second electrode layer 5 may be doped with an alkali metal or an alkali earth metal such as lithium, sodium, cesium, calcium, or the like.

The manufacturing method of the second electrode layer 5 includes the vacuum evaporation method, the sputtering method, the coating method, for example, to form a thin film using the above electrode material. When the second electrode layer 5 is the light-reflective electrode, the reflectivity is preferably 80% or more and is more preferably 90% or more.

When the second electrode layer 5 is the translucent electrode, it is preferable that the light transmissibility of the second electrode layer 5 is 70% or more. In this case, although a film thickness of a third electrode layer 5 differs depending on the material, characteristics such as light transmissibility of the second electrode layer 5, it is preferably set to 500 nm or less to control the characteristics such as the light transmissibility or the like of the third electrode layer 5, and it is particularly preferable that it is set within a range of 100 to 200 nm.

WORKING EXAMPLE

Next, a working example of the above preferred embodiment is particularly described by comparing the working example with a comparison example.

Working Example 1

An alkali-free glass plate of 0.7 mm thick (No. 1737 manufactured by Corning Incorporated) is used as the substrate 2. A solution which is made by dissolving a red emitting polymer ("Light Emitting Polymer ADS106RE" manufactured by American Dye Source, Inc.) in tetrahydrofuran (THF) solvent is applied to the substrate 2 by the spin coater so as to have a film thickness of 20 nm and subsequently baked at 100 degrees Celsius for ten minutes. Then, a solution, which is made by dispersing the mesoporous silica of particle diameter 50 nm (the nanosized particle 6) in butanol, is applied to the above baked solution and baked at 100 degrees Celsius for ten minutes. Subsequently, a solution which is made by dissolving the red emitting polymer ADS106RE in the THF solvent is further applied to the mesoporous silica film by the spin coater so as to have a film thickness of 100 nm in total, and subsequently baked at 100 degrees Celsius for ten minutes, and the emitting layer 43 (the organic thin film) is obtained. These are the procedure of the working example 1.

Comparison Example 1

A sample of the comparison example 1 is made in the same manner as the working example 1 except that the nanosized particles are not mixed into the light emitting layer 43.

Working Example 2

An alkali-free glass plate of 0.7 mm thick (No. 1737 manufactured by Corning Incorporated) is used as the substrate 2, and a ITO layer of 150 nm film thickness is formed on the substrate 2 by the sputtering using an ITO target (manufactured by Tosoh Speciality Materials Corporation). The substrate 2 on which the ITO layer is laminated is annealed under argon (Ar) atmosphere at 200 degrees Celsius for about one hour, and the first electrode 3 which has the sheet resistance of 18Ω/□ and functions as an anode having translucency is formed. Subsequently, Polyethylenedioxythiophene/polystyrenesulfonate (PEDOT-PSS: manufactured by H. C. Starck—V TECH Ltd., "Baytron P AL4083", PEDOT: PSS=1:6) is applied to the first electrode 3 by a spin coater so as to have a film thickness of 30 nm and is subsequently baked at approximately 150 degrees Celsius for ten minutes, and the hole injection layer 41 is obtained.

Subsequently, a solution which is made by dissolving TFB (Poly[(9,9-dioctylfluorenyl-2,7-diyl)-co-(4,4'-(N-(4-sec-butylphenyl))diphenylamine)]; manufactured by American Dye Source, Inc. "Hole Transport Polymer ADS259BE") in the THF solvent is applied to the hole injection layer 41 by the spin coater so as to have a film thickness of 12 nm, and thus a TFB coating is made. Subsequently, the substrate 2 is baked at 200 degrees Celsius for ten minutes, and the hole transport layer 42 is obtained. Moreover, a solution which is made by dissolving the red emitting polymer ("Light Emitting Polymer ADS111RE" manufactured by American Dye Source, Inc.) in the THF solvent is applied to the hole transport layer 42 by the spin coater so as to have a film thickness of 20 nm and subsequently baked at 100 degrees Celsius for ten minutes. Then, a solution, which is made by dispersing the mesoporous silica of particle diameter 30 nm (the nanosized particle 6) in butanol, is applied to the above baked solution and baked at 100 degrees Celsius for ten minutes. Furthermore, a solution, which is made by dissolving the red emitting polymer ADS106RE in the THF solvent is applied to the mesoporous silica film by the spin coater so as to have a film thickness of 100 nm in total, and subsequently baked at 100 degrees Celsius for ten minutes. Finally, Barium 5 nm thick and aluminum 80 nm thick are laminated on the emitting layer 43 by the vacuum deposition method to form the second electrode 5 which is the light-reflective cathode. Thus, the organic EL element 1 is obtained, and these are the procedure of the comparison (sic. correctly working) example 2.

Comparison Example 2

The organic EL element is made in the same manner as the working example 2 except that the nanosized particles 6 are not mixed into the light emitting layer 43.

Evaluation Test

Figure 2:
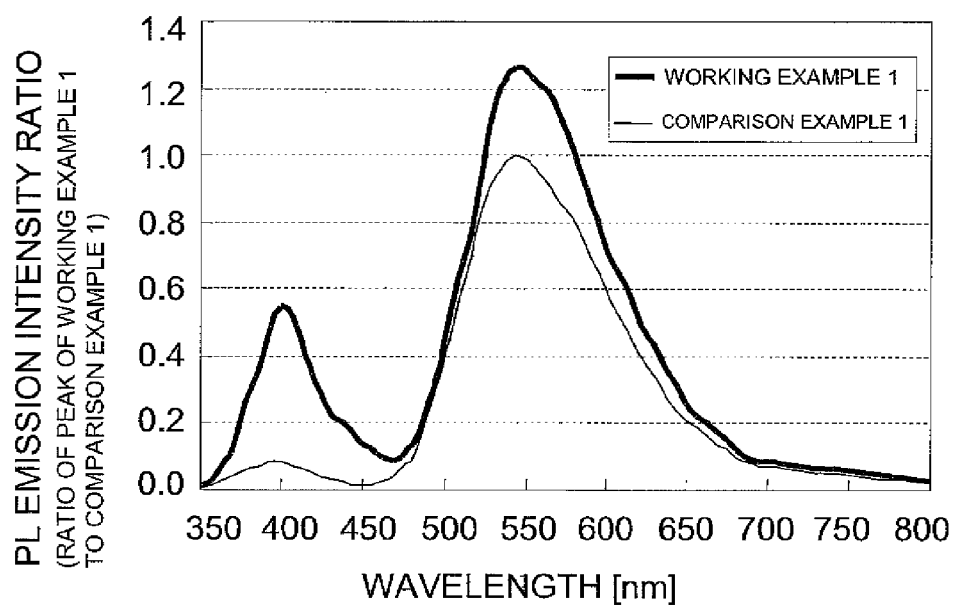
FIG. 2 is a diagram showing a photo-luminescence spectrum in a working example 1 of the organic thin film in FIG. 1 and a comparison example 1.

The working example 1 and the comparison example 1 are irradiated with ultraviolet light having a maximum value at a wavelength of 300 nm, and light spectrum excited and emitted by the ultraviolet light, that is to say, photoluminescence spectrum (abbreviated as the PL spectrum hereinafter) is measured by a luminance meter. Its result is shown in FIG. 2. FIG. 2 shows an intensity ratio supposing that a maximum intensity of the comparison example 1 is expressed as 1.

As shown in FIG. 2, in the comparison example 1 in which the nanosized particles 6 are not mixed into the light emitting layer 43, the PL spectrum having a substantially single maximum value in a wavelength region of 500 to 600 nm is measured. In contrast, in the working example 1 in which the nanosized particles 6 are mixed into the light emitting layer 43, the maximum value in the wavelength region of 500 to 600 nm increases compared to the comparison example 1.

Moreover, in the working example 1, the PL spectrum which has the noticeable maximum value in a wavelength region of 350 to 450 nm is measured.

Figure 3A:
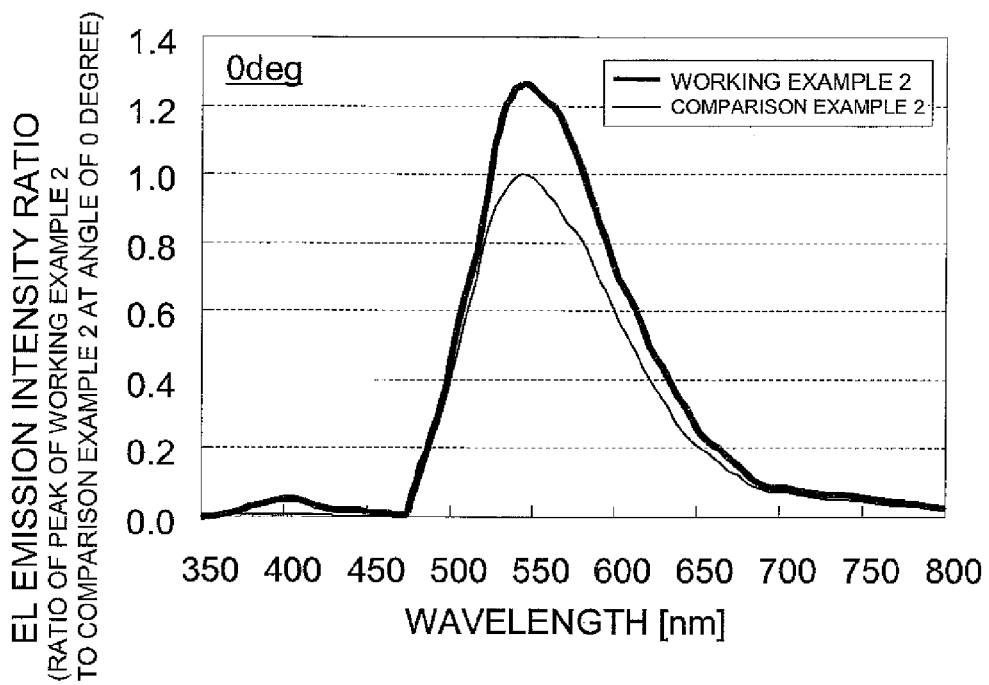
FIGS. 3A and 3B are diagrams showing emission spectra in a working example of the organic electroluminescent element in FIG. 1 and a comparison example.
Figure 3B:
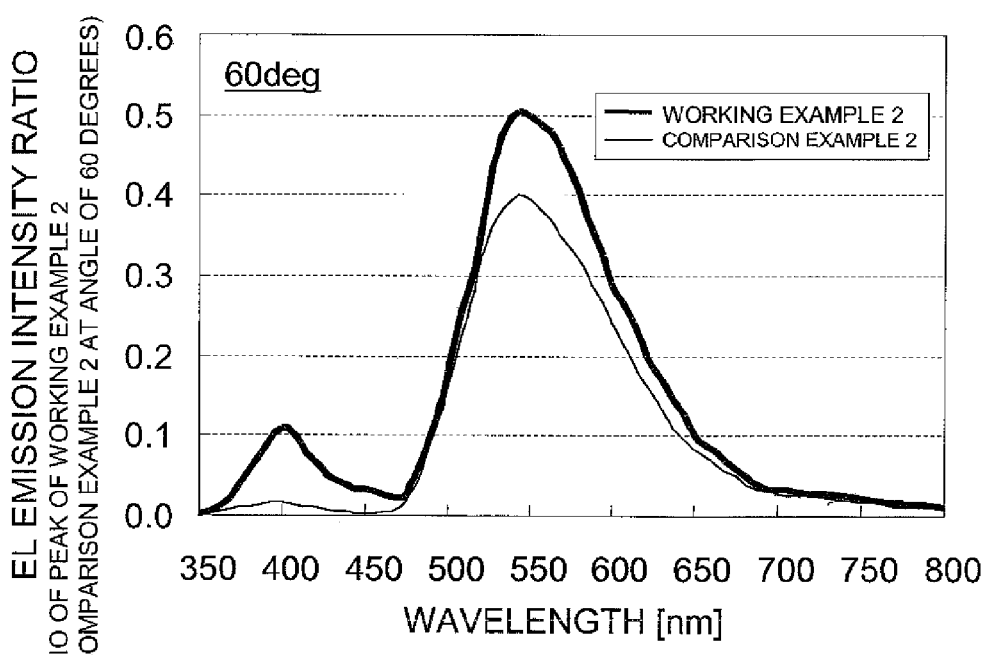

In the organic EL element made as the respective working example 2 and the comparison example 2, an electrical current having current density of 10 mA/cm² is applied between the electrodes, and the emission spectrum (abbreviated as the EL spectrum hereinafter) is measured by the luminance meter. The EL spectra of output angles 0 degree and 60 degrees are measured. The respective results are shown in FIGS. 3A and 3B. FIGS. 3A and 3B show intensity ratios supposing that an intensity of the comparison example 2 at output angle of 0 degree is expressed as 1.

Figure 4A:
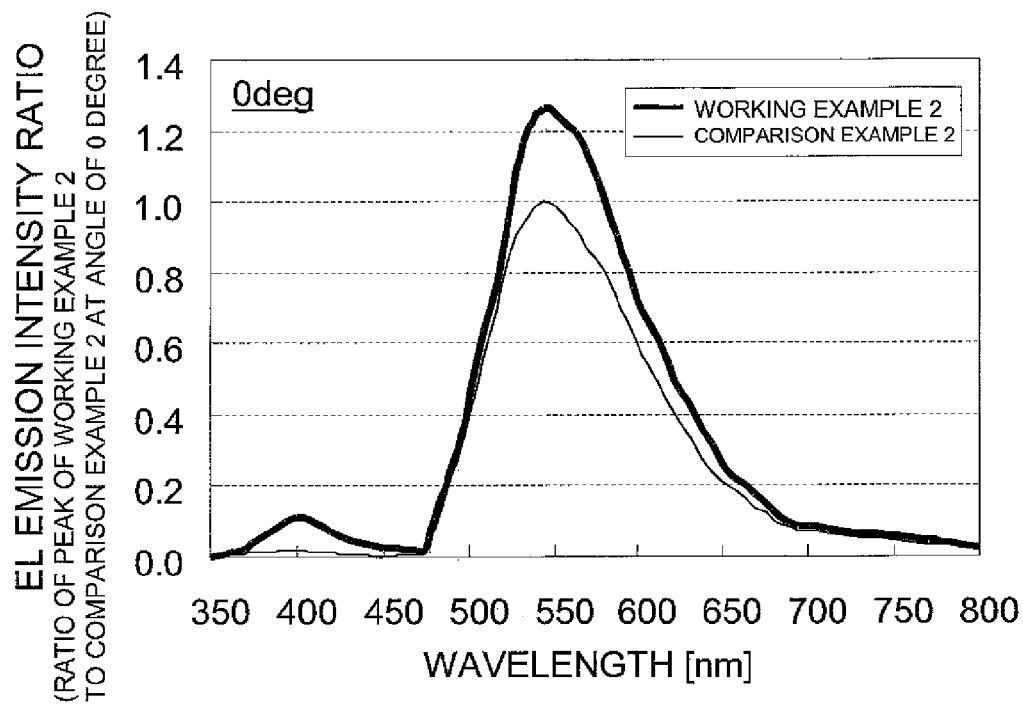
FIGS. 4A and 4B are diagrams showing emission spectra when a hemispherical lens is provided on a light emitting surface in the working example of the organic electroluminescent element in FIG. 1 and the comparison example.
Figure 4B:
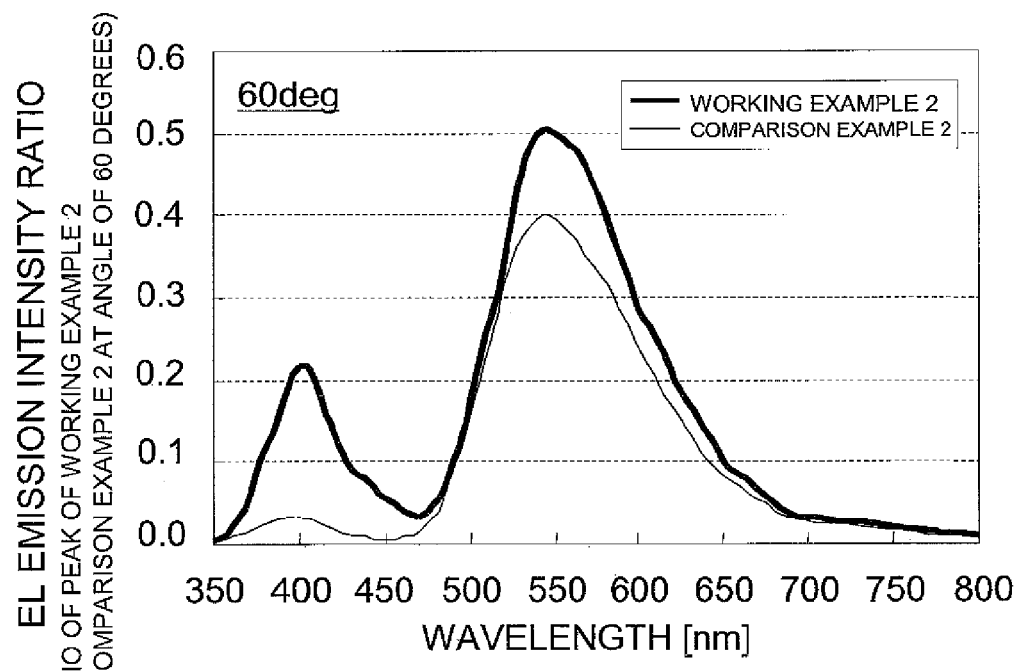
Figure 5:
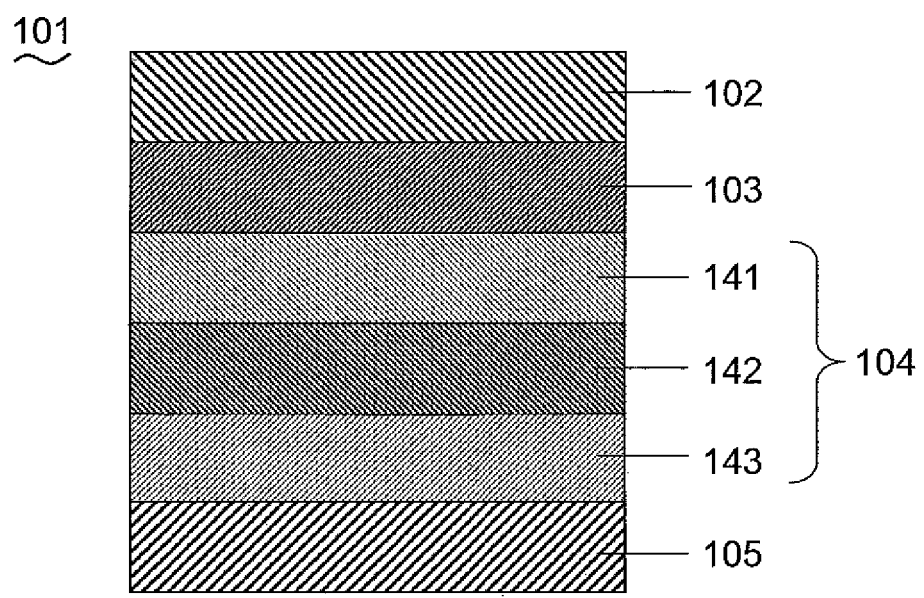
FIG. 5 is a side sectional view of a conventional organic electroluminescent element.

Subsequently, a hemispherical lens made of glass is disposed on respective emitting surfaces of the organic EL elements of the working example 2 and the comparison example 2 with matching oil, which has the same refractive index as the glass, interposed between the hemispherical lens and the emitting surfaces of the organic EL elements, and light reaching the substrate is measured in a manner similar to the above measuring method. The hemispherical lens enhances the light extraction efficiency from the substrate 2 to the atmosphere. In the same manner as the above, the EL spectra of output angles 0 degree and 60 degrees are measured. The respective results are shown in FIGS. 4A and 4B. In the same manner as the above, FIGS. 4A and 4B show intensity ratios supposing that an intensity of the comparison example 2 at output angle of 0 degree is expressed as 1.

As shown in FIGS. 3A and 3B and FIGS. 4A and 4B, in the comparison example 2 in which the nanosized particles 6 are not mixed into the light emitting layer 43, the EL spectrum having a substantially single maximum value in a wavelength region of 500 to 600 nm is measured. In contrast, in the working example 1 in which the nanosized particles 6 are mixed into the light emitting layer 43, the maximum value in the wavelength region of 500 to 600 nm increases compared to the comparison example 1. In particular, as shown in FIGS. 3B and 4B, when the output angle is 60 degrees, the EL spectrum which has more noticeable maximum value in the wavelength region of 350 to 450 nm is measured. This maximum value in the wavelength region of 350 to 450 nm is more noticeable when the hemispherical lens is disposed on the emitting surface.

In these results, the maximum value shown in the wavelength region of 500 to 600 nm is caused by the light emission from the molecular chain of the emitting material ADS106RE used for the light emitting layer 43. In contrast, the maximum value in the wavelength region of 350 to 450 nm is caused by the light emission from the main backbone of the emitting material ADS106RE. However, in the PL spectrum and the EL spectrum of the comparison examples 1 and 2 in which the nanosized particles 6 are not mixed into the light emitting layer 43, the maximum value caused by the light emission from the molecule chain is seen, however, the maximum value caused by the light emission from the main backbone is rarely seen.

In contrast, in the PL spectrum and the EL spectrum of the working examples 1 and 2 in which the nanosized particles 6 are mixed into the light emitting layer 43, the maximum value caused by the light emission from the main molecule chain increases compared to that of the comparison examples 1 and 2, and moreover, the maximum value caused by the light emission from the main backbone is noticeable. That is to say, it is recognized that usage efficiency of the light emitted by the molecule chain can be enhanced, and in addition, the light emitted by the main backbone can be used as the effective light when the nanosized particles 6 are mixed into the light emitting layer 43.

According to the light emitting layer 43 (the organic thin film) and the organic EL element 1 using the same, the emission spectra of the light emitted by the molecule chain and the main backbone of the emitting material 40 can be increased by the nanosized particle 6. The light which has the emission spectra having the plural maximum values can be generated without depending on the plural emitting materials, so that the organic layer 4 and the organic EL element 1 using the same can be manufactured easily.

The present invention is not limited to the configuration of the above preferred embodiment, however, various modification are applicable as long as the nanosized particles are mixed into the emitting material which is made up of the molecular chain, which emits the light having the maximum value at the wavelength different from the wavelength at which the emission spectrum emitted by the organic polymer main backbone has the maximum value, in the light emitting layer. For example, the emitting material whose main backbone is polymerized with plural types of molecular chains having different maximum values may be used, and plurality of such emitting materials may be mixed.

The present application is based on Japanese Patent Application 2011-083314, and the content there of is incorporated herein by reference to the specification and the drawings of the above patent application.

DESCRIPTION OF THE NUMERALS

1 organic EL element
2 substrate
3 first electrode layer
4 organic layer
40 emitting material
41 hole injection layer
42 hole transport layer
43 light emitting layer (organic thin film)
5 second electrode layer
6 nanosized particle

What is claimed is:

1. An organic thin film, comprising:
   an emitting material which is made up of an organic polymer main backbone polymerized with a molecular chain, which emits light having a maximum value at a wavelength different from a wavelength at which an emission spectrum emitted by the main backbone itself has a maximum value; and
   nanosized particles which are mixed into the emitting material.

2. The organic thin film according to claim 1, wherein the emitting material is a coating material.

3. The organic thin film according to claim 1, wherein the main backbone of the emitting material is a fluorene backbone.

4. The organic thin film according to claim 1, wherein a particle diameter of the nanosized particle is within 10 to 100 nm.

5. An organic electroluminescent element which is configured by laminating a substrate, a first electrode layer, an organic layer including a light emitting layer, and a second electrode layer, wherein
   the organic thin film according to claim 1 is included as the light emitting layer.

* * * * *